United States Patent [19]

Talbert

[11] Patent Number: 4,565,563

[45] Date of Patent: Jan. 21, 1986

[54] METHOD OF PRODUCING FERTILIZER PRODUCT CONTAINING SEWAGE SLUDGE

[76] Inventor: Norwood K. Talbert, 7586 Cavalry Cir., Manlius, N.Y. 13104

[21] Appl. No.: 691,635

[22] Filed: Jan. 14, 1985

Related U.S. Application Data

[60] Continuation-in-part of Ser. No. 224,858, Jan. 14, 1981, abandoned, which is a continuation-in-part of Ser. No. 56,989, Jul. 12, 1979, abandoned, which is a division of Ser. No. 932,622, Aug. 10, 1978, abandoned.

[51] Int. Cl.$^4$ .............................................. G05F 7/00
[52] U.S. Cl. ........................................... 71/12; 71/61; 71/63; 71/64.02; 71/64.03
[58] Field of Search ............... 71/12, 64.03, 64.02, 71/64.07, 64.12, 61, 63, 13, 27; 210/10, 18, 751, 770, 771, 768; 427/220

[56] References Cited

U.S. PATENT DOCUMENTS

| | | | |
|---|---|---|---|
| 3,050,383 | 8/1962 | Wilson | 71/12 X |
| 3,442,637 | 5/1969 | Hudson | 71/12 |
| 3,758,287 | 9/1973 | Scheel | 71/12 |
| 3,963,471 | 6/1976 | Hampton | 210/10 X |
| 4,038,180 | 7/1977 | Talbert | 71/12 X |
| 4,038,181 | 7/1977 | Talbert | 71/12 X |
| 4,125,465 | 11/1978 | Turovsky | 210/10 X |
| 4,167,479 | 9/1979 | Besik | 210/18 X |

FOREIGN PATENT DOCUMENTS

| | | | |
|---|---|---|---|
| 2339613 | 2/1975 | Fed. Rep. of Germany | 71/12 |
| 2516417 | 10/1976 | Fed. Rep. of Germany | 71/12 |
| 48-13673 | 4/1973 | Japan | 210/10 |
| 50-86160 | 7/1975 | Japan | 71/12 |
| 7504763 | 10/1976 | Netherlands | 71/12 |
| 410487 | 5/1934 | United Kingdom | 71/12 |
| 2028294 | 3/1980 | United Kingdom | 71/12 |

Primary Examiner—Kenneth M. Schor
Attorney, Agent, or Firm—Charles S. McGuire

[57] ABSTRACT

A fertilizer product consisting of solid, substantially dry, spherical or semi-spherical granules of ammonium sulfate and sewage sludge solids is formed by adding to a quantity of crystalline ammonium sulfate in a mixing vessel a second quantity of water-laden sludge while mixing the two together and driving off water from the sludge until granulation is complete. The sludge is added slowly enough, relative to the rate at which water is removed therefrom, that the ammonium sulfate crystals do not dissolve in the water initially contained in the sludge. Sludge solids effectively fill the voids between individual ammonium sulfate crystals in the resulting granules, thereby producing an end product of improved size and shape.

2 Claims, 1 Drawing Figure

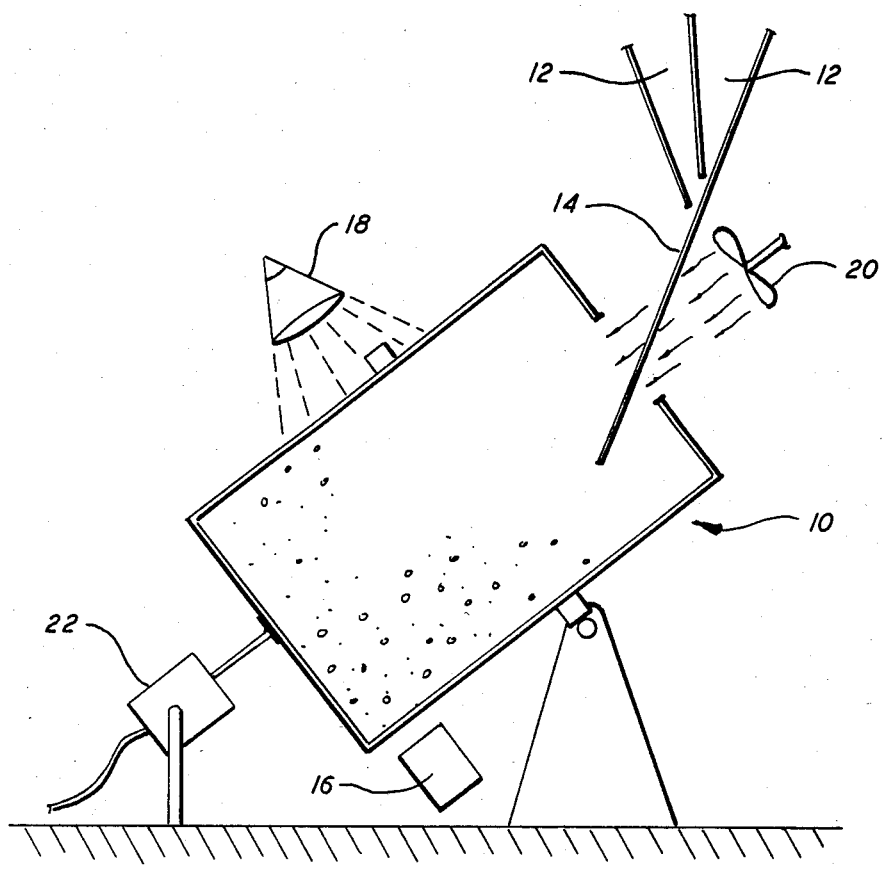

METHOD OF PRODUCING FERTILIZER PRODUCT CONTAINING SEWAGE SLUDGE

REFERENCE TO RELATED APPLICATIONS

The present application is a continuation-in-part of application Ser. No. 224,858, filed Jan. 14, 1981, which was a continuation-in-part of application Ser. No. 56,989, filed July 12, 1979, which was a division of application Ser. No. 932,622, filed Aug. 10, 1978, all of said prior applications now being abandoned.

BACKGROUND OF THE INVENTION

The present invention relates to novel methods of producing fertilizer products, and more specifically to methods of producing individual granules of fertilizer consisting essentially of a mixture of ammonium sulfate crystals and sewage sludge solids.

It has been recognized that useful fertilizer products may be provided in the form of solid granules consisting essentially of sewage sludge solids and fertilizer salts. Such a product results, for example, from the process described in applicant's prior U.S. Pat. No. 4,038,180 which is primarily concerned with more efficient methods of dewatering sludge to simplify handling and disposal, as well as to provide useful applications thereof. According to this method, wet sludge is mixed with concentrated acid and the resulting mixture of sludge solids and water-diluted acid is mixed with a base, such as ammonia. The heat of the acid-base reaction is utilized to drive off some or all of the water initially contained in the sludge as a granulated product is formed consisting of the salt resulting from the acid-base reaction and the sludge solids remaining after the water has been driven off. It is necessary, of course, to the practise of this method, that the wet sludge and acid be thoroughly mixed prior to contacting the solution with the base to initiate the reaction forming the salt.

Another method of producing a granular fertilizer product comprising a mixture of sewage sludge solids and fertilizer salts is described in U.S. Pat. No. 3,050,383 of J. F. Wilson. According to this method the sewage sludge is previously dried to provide sludge solids having a very low moisture content (3.2% or less) which are then combined in a water solution with the acid and base. Although this method has no utility in the dewatering of sewage sludges, which is the principal thrust of applicant's above-mentioned prior patent, the two methods will apparently produce the same or very similar granular fertilizer products.

Salts produced in acid-base reactions are normally in crystalline form, as opposed to the more desirable spherical or semispherical granular form when the salts are to be employed in solid fertilizer applications. Both of the prior art methods discussed above are able to achieve granulation of the end product with the aid of sludge solids which are present during the acid-base reaction. However, neither provides a process for aiding in the granulation, i.e., size and shape improvement, of salts which have already been formed in the crystalline state.

SUMMARY OF THE INVENTION

Ammonium sulfate is produced as a by-product in a number of industrial process such as in conjunction with steel mills and Nylon plants. Although this chemical has desirable soil nutrient properties, it is difficult to store and handle due to its finely divided crystalline structure and affinity for moisture. The present invention is directed to, and has for a principal object, the provision of a method of producing fertilizer granules of the desired size and shape from previously formed, crystalline ammonium sulfate.

The method is carried out by placing a quantity of ammonium sulfate, which may be recovered from other, unrelated industrial processes, in a granulation drum and adding sewage sludge which may be taken directly from an industrial or municipal sewage plant. The water content of such sewage is normally quite high, e.g., from around 75% to above 90%. If the water-laden sludge is simply contacted by the crystalline salt, as taught by another of applicant's prior patents (U.S. Pat. No. 4,038,181), the salt will dissolve in the water associated with the sludge and phase separation of the salt solution and sludge solids will occur. According to the present invention, the wet sludge is added to the vessel containing the ammonium sulfate and mixed therewith while simultaneously driving off moisture by applying heat from an external source and circulating air through the vessel. The sludge is added at a slow enough rate relative to the rate at which moisture is being removed, that instead of the salt dissolving in the sludge water, a granular product comprised of the ammonium sulfate crystals and sludge solids is formed.

DESCRIPTION OF THE DRAWING

The single drawing FIGURE is a diagrammatic illustration of a rotary granulator used to produce the fertilizer product in accordance with the method of this invention.

DETAILED DESCRIPTION

Crystalline ammonium sulfate which is recovered from the by-products of a conventional industrial process, such as those carried out in steel mills and Nylon plants, for example, is mixed with wet sewage sludge in a fertilizer granulation drum or similar mixing vessel. The proportions may be on the order of 10% by weight of wet sludge to 90% by weight of ammonium sulfate crystals, but this may vary widely depending not only on the water content of the sludge and the hygoscopicity of the ammonium sulfate, but upon local economics affecting the process. That is, the quantity and disposal problems associated with sewage sludge in certain areas may be at an economic premium while in other instances the dominant objective may be the conversion of cheap, readily available ammonium sulfate crystals to a high analysis, granulated fertilizer product.

Most sewage sludges contain about 75% water by weight; actual water content may range from 50 to 60% (particularly when the sludge has been filtered, or some evaporation has taken place in holding ponds or on sand beds) up to 99%. Thus, it is necessary to know about how much water the sludge initially contains in order to determine the rate at which the sludge may be added and moisture withdrawn from the process in order to achieve the desired granulation. That is, the invention is base upon the discovery that wet sewage sludge may be added to crystalline ammonium sulfate to produce semi-spherical granules of a mixture of agglomerated ammonium sulfate crystals and sludge solids which is a most useful and desirable fertilizer product provided that the rate at which the sludge is added relative to the rate at which moisture is removed is such that the salt crystals do not dissolve in the water initially contained in the sludge.

As used in the present specification, including the claims, the term "wet sewage sludge" is defined as sludge having a water content within the aforementioned range, i.e., 50% to 99% by weight.

One example, indicated diagrammatically in the drawing, is to mix crystals of previously formed ammonium sulfate in granulation drum 10 with wet sewage sludge which is added at a predetermined rate. Heat from external heat source 16 and/or infrared lamp 18 evaporate the water in the sludge, and the resulting water vapor is withdrawn from the drum with the aid of circulating air from blower 20. The salt crystals and sludge may be added to drum 10 through hopper 12 and chute 14. Granulation drum 10 may be rotated by motor 22. The elements of apparatus are considered to be conventional and form no part of the present invention.

Specific examples of experiments demonstrating the process of the invention are as follows:

EXAMPLE I

A crystalline ammonium sulfate and a typical municipal sewage sludge obtained from the Syracuse-Minoa sludge plant were introduced into the rotating granulator 10 through hopper 12 and chute 14. Heat was applied from source 16 and infrared lamp 18 to the exterior of the drum 10. The sludge was found to contain about 75% by weight of water and was added at a slow rate to the drum while observing the moisture to insure that the salt crystals were not dissolving to produce a phase separation of dissolved salt and water solution, and sludge solids. Moisture was removed from the mixture to form agglomerated granules consisting of a relatively homogeneous mixture of ammonium sulfate crystals with the voids therebetween filled by sludge solids. The resulting spherical or semi-spherical granules had a surface composed principally of sludge solids which provided a most desirable product, not only from the standpoint of granule size and shape but also from the greatly reduced hygroscopicity from that exhibited by ammonium sulfate and other such fertilizer salts in the crystalline state alone.

EXAMPLE II 70 g of ammonium sulfate crystals was mixed with 50 g of wet sludge in a rotating granulator under the conditions described in Example I. Quantitative measurements taken on a dry basis showed that the resulting granules contained 15.1% sludge solids. The effectiveness of granule size was measured by determining the quantity of a petroleum solvent, in which the fertilizer granules are insoluble, required to fill the void spaces in a quantity of granules. The results of this test are as follows:

|  | Ammonium Sulfate | Ammonium Sulfate and Sludge |
| --- | --- | --- |
| weight of crystals/granules (volumetric) | 24 G | 14 g |
| density of crystals/granules | 1.035 | 0.69 |
| volume of crystals/granules | 28 cc | 20.3 cc |
| volume of kerosene | 8.45 cc | 8.45 cc |
| % of voids | 30% | 41.75% |
| % increase of voids |  | 39% |

The significance of the above test is the high amount of enlargement of the fertilizer salt crystals when granulated with sludge.

To measure the hygroscopicity of the ammonium sulfate with and without sludge, the materials were enclosed in a humidity chamber and treated separately by being exposed to water vapor, without contact with liquid water. The results of this test was as follows:

|  | Ammonium Sulfate | Ammonium Sulfate and Sludge |
| --- | --- | --- |
| Initial weight | 11 g | 11 g |
| Weight after 26 hrs. | 12 g | 11 g |
| Water pick-up (g) | 1 g | 0 |
| Water pick-up (%) | 9.1% | 0 |

No further increase of weight was observed after an additional 12 hours in the humidity chamber. The tests indicated that granulating the ammonium sulfate with sewage sludge significantly reduced hygroscopicity.

It is again emphasized that the process of the present invention relies upon the controlled addition of wet sewage sludge to previously formed, crystalline ammonium sulfate, such as that which may be produced as a by-product in chemical processes entirely distinct from the chemical fertilizer industry. If desired, other soil nutrients may be added in the process of granulating the ammonium sulfate sludge so that the fertilizer product contains desired amounts of one or more other chemicals.

What is claimed is:

1. The method of producing a fertilizer product consisting of solid, individual, spherical or semi-spherical granules of substantially homogeneously mixed ammonium sulphate crystals and sewage sludge solids comprising the steps of:
   (a) determining the approximate water content of a quantity of wet sewage sludge;
   (b) placing a quantity of crystalline ammonium sulphate in a mixing vessel;
   (c) adding said wet sludge to said mixing vessel at a predetermined rate; and
   (d) mixing said ammonium sulphate and sewage sludge together in said vessel and driving off water from said sewage sludge continuously as said sewage sludge is added to said vessel, said water being driven off by applying heat to said mixing vessel and circulating air over the mixture therein to carry away evaporated moisture and said mixing resulting in the producing of said fertilizer product;
   (e) the predetermined rate of adding the wet sludge being that rate, relative to the rate of said driving off of water, at which rate sludge solids mix with said ammonium sulphate crystals to form individual, substantially dry, solid granules, without dissolving said ammonium sulphate crystals in the water initially contained by said wet sewage sludge.

2. The method according to claim 1 wherein said mixing vessel is a fertilizer granulation drum.

* * * * *